United States Patent [19]

Tobise

[11] Patent Number: 4,562,390
[45] Date of Patent: Dec. 31, 1985

[54] INSULATION RESISTANCE MEASUREMENT IN STATIC LEONARD APPARATUS

[75] Inventor: Masahiro Tobise, Katsuta, Japan

[73] Assignee: Hitachi, Ltd., Tokyo, Japan

[21] Appl. No.: 657,081

[22] Filed: Oct. 3, 1984

[30] Foreign Application Priority Data

Oct. 5, 1983 [JP] Japan .................. 58-185067

[51] Int. Cl.$^4$ ............................... G01R 31/02
[52] U.S. Cl. ...................... 318/490; 324/54; 340/647
[58] Field of Search ............ 318/490; 340/647, 648; 324/54, 51

[56] References Cited

FOREIGN PATENT DOCUMENTS

| | | | |
|---|---|---|---|
| 56-86365 | 7/1981 | Japan | 324/54 |
| 56-104257 | 8/1981 | Japan | 324/54 |
| 0792156 | 12/1980 | U.S.S.R. | 324/54 |
| 0935832 | 6/1982 | U.S.S.R. | 324/54 |

Primary Examiner—William M. Shoop, Jr.
Assistant Examiner—Bentsu Ro
Attorney, Agent, or Firm—Antonelli, Terry & Wands

[57] ABSTRACT

In a static leonard apparatus, a DC motor is supplied from a thyristor converter through a main circuit switch, and a capacitor is connected between the DC output buses of the thyristor converter. When the main circuit switch is turned off, a grounding switch is turned on to ground one of the DC output buses to form a grounded closed discharge circuit including the DC motor through which the capacitor discharges. During the turned-off period of the main circuit switch, the capacitor is charged with the output voltage of the thyristor converter. The capacitor discharges through the grounded closed discharge circuit. The voltage values of the discharging capacitor at two points on the time axis are detected to compute the discharge time constant of the capacitor, and, on the basis of the computed discharge time constant, the insulation resistance of the DC motor is measured.

6 Claims, 8 Drawing Figures

ND STATIC LEONARD APPARATUS

INSULATION RESISTANCE MEASUREMENT IN STATIC LEONARD APPARATUS

This invention relates to improvements in a static leonard apparatus using a thyristor converter for driving a DC motor.

In a static leonard apparatus using a thyristor converter for driving a DC motor, it is necessary to measure the insulation resistance of the DC motor. The measurement of the insulation resistance of the DC motor is periodically made at intervals of, for example, three months.

According to a prior art practice employed for the measurement of the insulation resistance of each of DC motors controlled by an associated thyristor converter, a main circuit switch inserted in one of the DC output buses of the thyristor converter is turned off, and an insulation resistance tester is connected between the positive bus (or the negative bus) and ground. However, such a prior art practice, in which an insulation resistance tester is connected for each individual DC motor and is removed from the position after completion of the measurement, is defective in that a very long period of time is required for the measurement of the insulation resistance of all the DC motors. This is because a length of time of about 30 minutes is required for the measurement of the insulation resistance of each individual DC motor. In a rolling mill in which as many as several hundred DC motors are installed, many operators must be secured in order that inspection of the insulation resistance of such many DC motors can be finished in one day. Therefore, it is now strongly demanded to develop a method by which the insulation resistance of the DC motor in the static leonard apparatus can be measured simply within a short length of time.

With a view to satisfy the above demand, it is a primary object of the present invention to provide an improved static leonard apparatus in which the insulation resistance of a DC motor can be measured simply within a short length of time.

The improved static leonard apparatus according to the present invention is featured by connecting a capacitor between the DC output buses of the thyristor converter, grounding one of the DC output buses to constitute a closed capacitor discharge circuit including the DC motor, and computing the discharge time constant of the capacitor to measure the insulation resistance of the DC motor.

Other objects and features of the present invention will be apparent from the following detailed description taken in conjunction with the accompanying drawings, in which.

Figure 1:
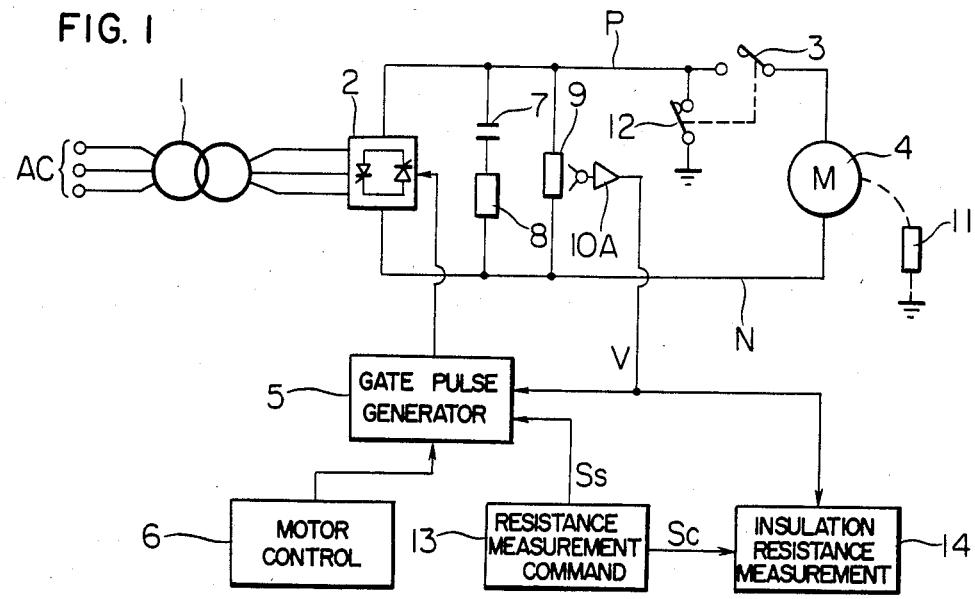
FIG. 1 shows the structure of a preferred embodiment of the static leonard apparatus according to the present invention.

Referring to FIG. 1, a thyristor converter 2 converts an alternating current supplied from an AC power source AC through a power transformer 1 into a direct current. In FIG. 1, the thyristor converter 2 is of the reversible type. A DC motor 4 is connected through a main circuit switch 3 to the DC output terminals of the thyristor converter 2. Although the thyristor converter 2 is the reversible one, the upper and lower DC output buses of the thyristor converter 2 in FIG. 1 are referred to as a positive bus and a negative bus P and N respectively herein for conveniences of description. A series circuit of a surge absorbing capacitor 7 and a resistor 8 is connected between the buses P and N. A voltage detecting resistor 9 is also connected between the buses P and N. A grounding switch 12 is connected to the positive bus P to be turned on when the main circuit switch 3 inserted in the positive bus P is turned off.

A motor control circuit 6 includes a speed control circuit, a current control circuit, etc. and applies a phase control signal to a gate pulse generating circuit 5. The gate pulse generating circuit 5 effects triggering control of the thyristor converter 2 with the phase angle corresponding to the phase control signal applied from the motor control circuit 6. The voltage applied across the resistor 9 is detected by a voltage detector 10A such as an insulating amplifier, and the detected voltage signal V is applied to both of the gate pulse generating circuit 5 and an insulation resistance measuring circuit 14. The reason why the detected voltage signal V from the voltage detector 10A is applied to the gate pulse generating circuit 5 is that the triggering phase of the regenerative converter be maintained at a predetermined value corresponding to the level of the detected voltage signal V during change-over from the motoring operation to the regenerative operation of the DC motor 4 thereby ensuring a quick deceleration of the DC motor 4. At the time of measurement of the insulation resistance of the DC motor 4, a resistance measurement commanding circuit 13 applies a measurement start signal $S_s$ to the gate pulse generating circuit 5 and a measurement command signal $S_c$ to the insulation resistance measuring circuit 14. The reference numeral 11 designates the insulation resistance of the DC motor 4.

The operation of the static leonard apparatus which controls the triggering phase of the thyristor converter 2 thereby controlling the DC motor 4 is well known, and any detailed description thereof is unnecessary.

Figure 3:
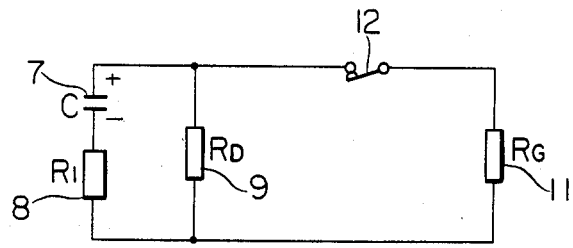
FIG. 3 is a circuit diagram of the closed discharge circuit in FIG. 1.

Now, when the DC motor 4 is not in operation (hence, the main circuit switch 3 is turned off), the grounding switch 12 is first turned on to prepare for the measurement of the insulation resistance of the DC motor 4. At this time, the capacitor 7 is in the state of storing zero charges. This is because the capacitor 7 discharges through the main circuit switch 3 and DC motor 4 as soon as the operation of the DC motor 4 is stopped. The resistance value of the windings of the DC motor 4 is generally very small or less than 1 Ω. After the grounding switch 12 is turned on, the measurement start signal $S_s$ is applied to the gate pulse generating circuit 5 from the resistance measurement commanding circuit 13. In response to the application of the measurement start signal $S_s$, the gate pulse generating circuit 5 effects the triggering control of the thyristor converter 2 for a predetermined period of time thereby charging the capacitor 7. Although the grounding switch 12 is in its on position at this time, the DC output of the thyristor converter 2 is consumed for the charging of the capacitor 7 since the resistance value $R_G$ of the insulation resistance 11 of the DC motor 4 is large. Where there is a possibility of current flow through the grounding switch 12 during the period of charging of the capacitor 7, the grounding switch 12 may be turned on after the capacitor 7 is charged for a predetermined period of time. When the triggering control of the thyristor converter 2 is ceased (the gate suppression) after the capacitor 7 is charged for the predetermined period of time, the capacitor 7 discharges through the resistor 9 and also through the DC motor 4 (the insulation resistance 11) as shown in FIG. 3. The discharge time constant T of the capacitor 7 at this time is given by the following equation when the winding resistance of the DC motor 4 is ignored:

$$T = C \times \left( R_1 + \frac{R_D \times R_G}{R_D + R_G} \right) \quad (1)$$

$$= C \times \left( R_1 + \frac{R_G}{1 + R_G/R_D} \right)$$

where
C: capacitance value of capacitor 7
$R_1$: Resistance value of resistor 8
$R_D$: Resistance value of resistor 9
$R_G$: Insulation resistance value In the static leonard apparatus, the capacitance value C of the capacitor 7, the resistance value $R_1$ of the resistor 8, and the resistance value $R_D$ of the resistor 9 are generally several $\mu F$, several 10 $\Omega$ and several 100 k$\Omega$ respectively. Further, although the insulation resistance value $R_G$ of the DC motor 4 is normally about several M$\Omega$ to several 100 M$\Omega$, it decreases to about several 10 k$\Omega$ to 100 K$\Omega$ when an insulation deterioration occurs.

Now, the insulation resistance value $R_G$ is computed from the equation (1) to provide the following equation:

$$R_G = \left( \frac{T}{C} - R_1 \right) \left( 1 + \frac{R_G}{R_D} \right) \quad (2)$$

The left-hand and right-hand members of the equation (2) are divided by $R_G$, and the reciprocal of the result is then taken to provide the following equation:

$$\frac{1}{R_G} = \frac{1}{T/C - R_1} - \frac{1}{R_D} \quad (3)$$

The reciprocal of the equation (3) is computed to find the insulation resistance value $R_G$ as follows:

$$R_G = \left( \frac{1}{T/C - R_1} - \frac{1}{R_D} \right)^{-1} \quad (4)$$

It will be apparent from the equation (4) that the larger the value of the discharge time constant T, the value of the first term of the right-hand member in the equation (4) becomes smaller, and this means that the insulation resistance value $R_G$ is larger. On the other hand, the smaller the discharge time constant T, the value of the first term in the right-hand member in the equation (4) becomes larger, and this means that the insulation resistance value $R_G$ is smaller. Thus, there is a correlation between the value of the discharge time constant T and the insulation resistance value $R_G$.

Especially, when the insulation resistance value $R_G$ becomes so small as to satisfy the relation $1 >> R_G/R_D$, the equation (2) can be expressed as follows:

$$R_G = \frac{T}{C} - R_1 \quad (5)$$

Figure 4:
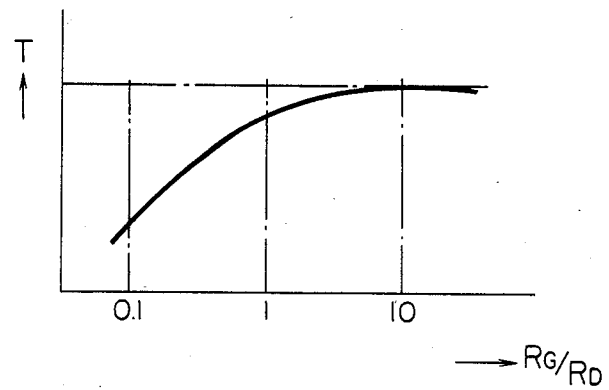
FIG. 4 is a graph showing the relation between the insulation resistance and the capacitor discharge time constant in FIG. 3.

Generally, there is the relation $R_G >> R_1$, and the capacitance value C of the capacitor 7 is constant. Therefore, in the range of $1 >> R_G/R_D$, the insulation resistance value $R_G$ varies in proportion to the value of the discharge time constant T. The relation between the insulation resistance value $R_G (R_G/R_D)$ and the value of the discharge time constant T is as shown in FIG. 4.

It will thus be seen that the smaller the insulation resistance value $R_G$ of the DC motor 4, the value of the discharge time constant T becomes smaller.

The discharge time constant T will be computed on the basis of practical numerical values of C, $R_1$, $R_D$ and $R_G$.

Suppose that the capacitance value C of the capacitor 7=4 $\mu F$, the resistance value $R_1$ of the resistor 8=40 $\Omega$, the resistance value of the resistor 9=200 k$\Omega$, and the normal insulation resistance value $R_G$=10 M$\Omega$. Then, the value of the discharge time constant T in the above case is computed from the equation (1) as follows:

$$T = 4\ \mu F \times \left( 40\ \Omega + \frac{200\ k\Omega \times 10\ M\Omega}{200\ k\Omega + 10\ M\Omega} \right)$$

The value of the discharge time constant T is as follows when the resistance value $R_1$ of the resistor 8 is ignored:

$T \approx 0.78$ (sec)

On the other hand, the value of the discharge time constant T is as follows when the insulation resistance value $R_G$ decreases to 50 k$\Omega$:

$T \approx 0.16$ (sec)

It will thus be seen that the insulation resistance value $R_G$ of the DC motor 4 is correlated with the discharge time constant T of the capacitor 7, and the insulation resistance value $R_G$ can be measured by measurement of the discharge time constant T.

Figure 5:
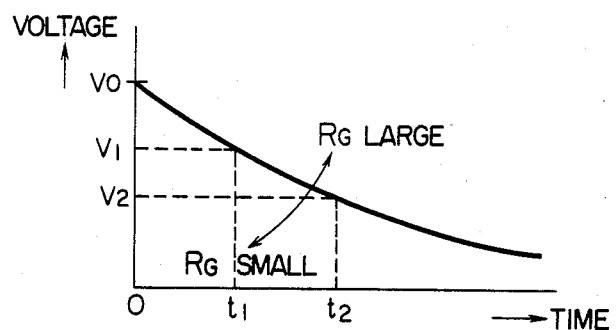
FIG. 5 is a graph showing the discharge characteristic of the capacitor.

A method for measuring the discharge time constant T will now be described with reference to FIG. 5.

Suppose that the voltage charged in the capacitor 7, hence the initial voltage value detected by the voltage detector 10A is $V_0$, the voltage value detected at time $t_1$ after starting of the capacitor discharge is $V_1$, and the voltage value detected at time $t_2$ later by a predetermined period of time $\Delta T$ from the time $t_1$ is $V_2$. Then, the voltages $V_1$ and $V_2$ can be expressed as follows when the resistance value $R_1$ of the resistor 8 is ignored:

$$V_1 = V_0 \times exp(-t_1/T) \quad (6)$$

$$V_2 = V_0 \times exp\,(-t_2/T) \tag{7}$$

Division of the equation (6) by the equation (7) provides the following ratio:

$$V_1/V_2 = exp\,(-t_1/T + t_2/T) \tag{8}$$

The discharge time constant T is computed from the equation (8) as follows:

$$\begin{aligned}T &= (t_2 - t_1)/\ln(V_1/V_2) \\ &= \Delta t/\ln(V_1/V_2)\end{aligned} \tag{9}$$

It will be apparent from the equation (9) that the discharge time constant T is not related with the initial discharged voltage value $V_0$ of the capacitor 7 and can be measured on the basis of the voltage measurement times $t_1$, $t_2$ and the detected voltage values $V_1$, $V_2$.

Figure 2:
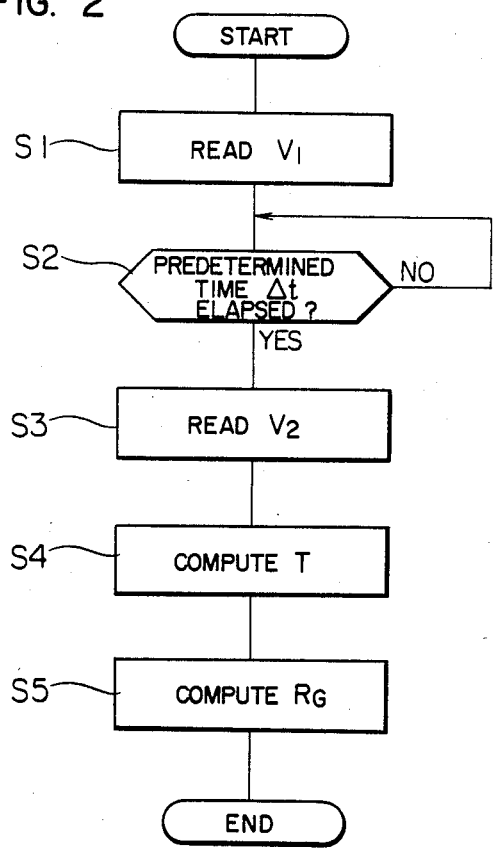
FIG. 2 is a flow chart showing the steps of processing in the insulation resistance measuring circuit shown in FIG. 1.

In response to the application of the measurement command signal $S_c$ from the resistance measurement commanding circuit 13 in FIG. 1, the insulation resistance measuring circuit 14 executes processing, as shown in FIG. 2, on the detected voltage signal V applied from the voltage detector 10A thereby measuring the insulation resistance value $R_G$ of the DC motor 4. The resistance measurement commanding circuit 13 generates the measurement command signal $S_c$ at time $t_1$ which is later by a period of time $t_1$ from the time (the point 0 on the time axis shown in FIG. 5) at which the thyristor converter 2 has been subjected to the gate suppression.

Referring to FIG. 2, in response to the application of the measurement command signal $S_c$ from the resistance measurement commanding circuit 13, the voltage value $V_1$ detected at time $t_1$ is read in the step $S_1$. Whether or not the predetermined period of time $\Delta t$ has elapsed after the detected voltage value $V_1$ was read in the step $S_1$ is judged in the next step $S_2$. When the result of judgment in the step $S_2$ is "YES", the step $S_2$ is followed by the step $S_3$. In the step $S_3$, the voltage value $V_2$ detected at time $t_2$ is read, and, in the next step $S_4$, the discharge time constant T is computed according to the equation (9). In the step $S_5$, the value of the discharge time constant T computed in the step $S_4$ is used to compute the insulation resistance value $R_G$ according to the equation (4). The insulation resistance measuring circuit 14 detects the insulation resistance value $R_G$ by executing the steps of processing described above.

In the manner described above, the insulation resistance value $R_G$ of the DC motor 4 is measured, and, for this purpose, the discharge time constant T of the capacitor 7 is measured to detect the insulation resistance value $R_G$. Therefore, the prior art steps of connecting the insulation resistance tester for each individual DC motor and then removing the insulation resistance tester from the connected position are unnecessary, so that the insulation resistance can be measured simply within a short length of time.

Further, in the embodiment of the present invention shown in FIG. 1, a conventional surge absorbing capacitor is used as the capacitor 7, and a voltage detector generating a detected voltage signal used heretofore for the control of a static leonard apparatus is utilized for the measurement of the insulation resistance. Therefore, the apparatus of the present invention requires merely additional provision of a grounding switch and is simple in construction.

Figure 6:
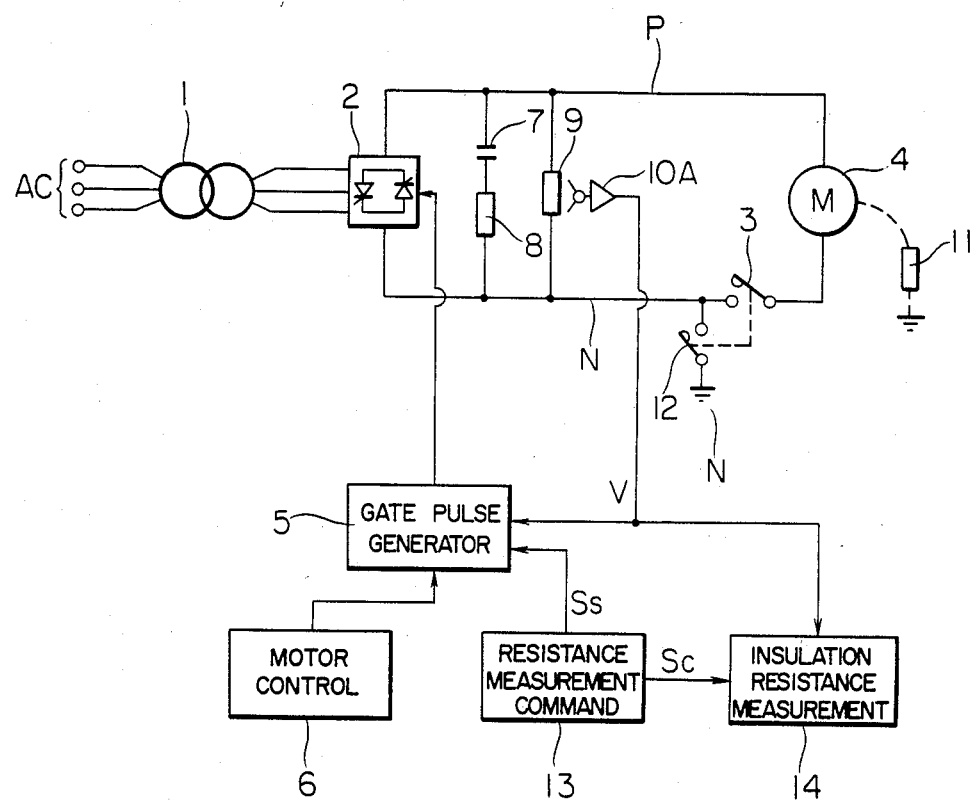
FIGS. 6 and 7 show the structure of other embodiments of the present invention.

FIG. 6 shows the structure of another embodiment of the present invention. The embodiment shown in FIG. 6 is a modification of that shown in FIG. 1 in that the main circuit switch 3 is inserted in the negative bus N, and the grounding switch 12 connects the negative bus N to ground.

In the embodiment of FIG. 6 too, a closed discharge circuit for discharging the capacitor 7 through the DC motor 4 is formed when the grounding switch 12 is turned on. Therefore, in the embodiment shown in FIG. 6 too, the insulation resistance can be measured in a manner similar to that described with reference to the embodiment shown in FIG. 1.

Figure 7:
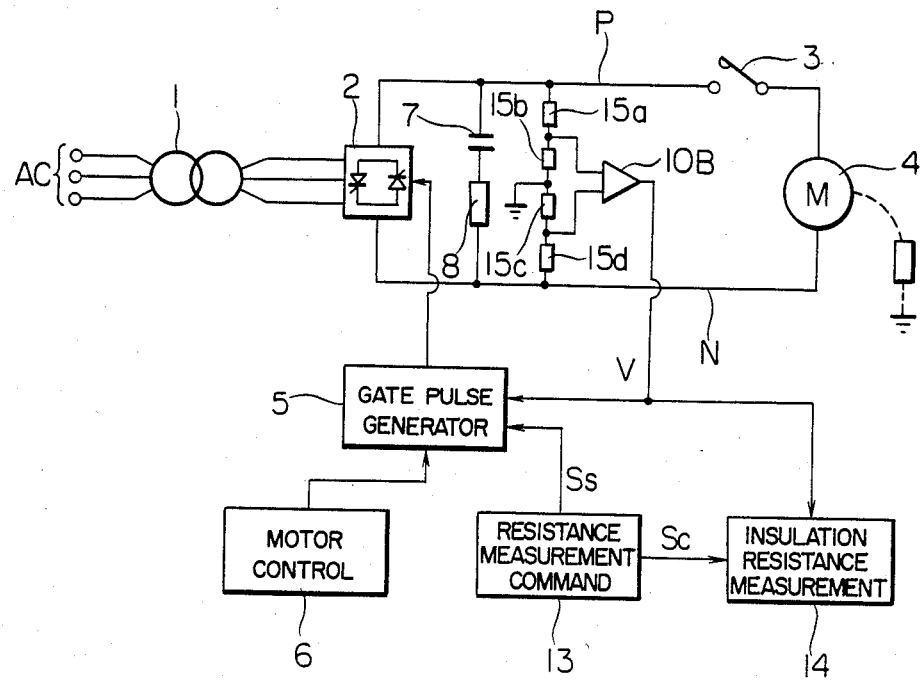

FIG. 7 shows the structure of still another embodiment of the present invention which is another modification of the embodiment shown in FIG. 1.

Referring to FIG. 7, four resistors 15a to 15d are connected in series between the buses P and N, with the middle point of the series connection (the connection point of the resistors 15b and 15c) being grounded, and the potential at the connection point of the resistors 15a, 15b and the potential at the connection point of the resistors 15c, 15d are applied as inputs to an operational amplifier acting as a voltage detector 10B detecting the voltage. Such voltage detecting means is employed in a static leonard apparatus where the voltage across the buses P and N (the main circuit voltage) is relatively low. The resistors 15a and 15d have a resistance value of about 98 k$\Omega$, and the resistors 15b and 15c have a resistance value of about 2 k$\Omega$.

Figure 8:
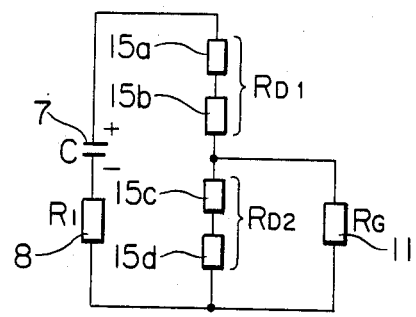
FIG. 8 is a circuit diagram of the closed discharge circuit in FIG. 7.

In the embodiment shown in FIG. 7, the capacitor 7 discharges through a grounded closed discharge circuit as shown in FIG. 8. The symbols $R_{D1}$ and $R_{D2}$ designate the sum of the resistance values of the resistors 15a, 15b and the sum of the resistance values of the resistors 15c, 15d, respectively. When the winding resistance of the DC motor 4 is ignored in FIG. 8, the discharge time constant T of the capacitor 7 is given by the following equation:

$$T = C \times \left( R_1 + R_{D1} + \frac{R_{D2} \times R_G}{R_{D2} + R_G} \right) \tag{10}$$

The insulation resistance value $R_G$ in the equation (10) is expressed as follows when expressed to correspond to the equation (4):

$$R_G = \left( \frac{1}{\frac{T}{C} - (R_1 + R_{D1})} - \frac{1}{R_{D2}} \right)^{-1} \tag{11}$$

Thus, in the embodiment shown in FIG. 7 too, the capacitor 7 discharges through the closed discharge circuit including the DC motor 4, so that the insulation resistance can be measured in a manner similar to that described with reference to the embodiment shown in FIG. 1. In the embodiment shown in FIG. 7, the grounding switch need not be provided since the bus P is grounded through the resistors 15a and 15b.

It will be understood from the foregoihg detailed description of the present invention that the insulation resistance of a DC motor in a static leonard apparatus can be simply measured within a short length of time.

The present invention exhibits an especially marked effect when applied to, for example, a rolling mill including many static leonard apparatus.

The aforementioned embodiments of the present invention have referred to the case where the thyristor converter is of the reversible type. It is apparent, however, that the present invention is equally effectively applicable to a static leonard apparatus which includes a one-way thyristor converter. Further, when the voltage charged in the capacitor is directly measured, the insulation resistance of the DC motor can be measured without provision of the voltage detecting resistor or resistors.

1. A static leonard apparatus comprising:
   (a) a thyristor converter converting an alternating current into a direct current;
   (b) a DC motor to which the DC output of said thyristor converter is supplied through a main circuit switch;
   (c) a capacitor connected between the DC output buses of said thyristor converter;
   (d) grounding means for grounding one of said DC output buses thereby forming a grounded closed discharge circuit for discharging said capacitor through said DC motor, said grounding means establishing said grounded closed discharge circuit when said main circuit switch is turned off;
   (e) charging control means for effecting the triggering control of said thyristor converter to charge said capacitor, said charging control means charging said capacitor when said main circuit switch is in its turned-off position;
   (f) voltage detecting means for detecting the voltage of said capacitor; and
   (g) insulation resistance detecting means for computing the discharge time constant of said capacitor discharging through said grounded closed discharge circuit thereby detecting the insulation resistance of said DC motor on the basis of the computed discharge time constant.

2. A static leonard apparatus as claimed in claim 1, wherein said voltage detecting means detects the voltage across a resistor connected between said DC output buses of said thyristor converter, and said resistor is connected in parallel with said DC motor in said grounded closed discharge circuit.

3. A static leonard apparatus as claimed in claim 1, wherein said grounding means includes a switch which, when turned on, grounds one of said DC output buses of said thyristor converter, and said grounding switch is turned on when said main circuit switch is turned off.

4. A static leonard apparatus as claimed in claim 1, wherein said grounding means includes a plurality of resistors connected between said DC output buses of said thyristor converter, and the middle point of said resistors is grounded.

5. A static leonard apparatus as claimed in claim 1, wherein said insulation resistance detecting means computes the discharge time constant on the basis of the voltage values detected at two suitable points on the time axis after starting of the discharge of said capacitor.

6. A static leonard apparatus as claimed in claim 1, wherein said capacitor acts also as a surge absorbing element.

* * * * *